United States Patent [19]

Reddy et al.

[11] Patent Number: 5,050,093
[45] Date of Patent: Sep. 17, 1991

[54] METHOD AND APPARATUS FOR INSPECTING ELECTRICAL WIRE

[75] Inventors: Mahender Reddy, Renton; Douglas M. Sargent; Jerome D. Johnson, both of Kirkland; James C. Stevens, Issaquah, all of Wash.

[73] Assignee: The Boeing Company, Seattle, Wash.

[21] Appl. No.: 424,750

[22] Filed: Oct. 19, 1989

[51] Int. Cl.$^5$ ............................................. G01R 31/08
[52] U.S. Cl. ................................... 364/507; 364/562; 324/513; 324/515; 324/541; 324/544
[58] Field of Search ............... 324/513, 515, 541, 544; 364/507, 562, 550; 356/430; 250/562, 560, 572

[56] References Cited

U.S. PATENT DOCUMENTS

| | | |
|---|---|---|
| 2,456,704 | 12/1948 | Henning . |
| 2,471,560 | 5/1949 | Everson et al. . |
| 2,476,279 | 7/1949 | Boynton . |
| 2,643,285 | 6/1953 | Cranford . |
| 2,809,349 | 10/1957 | Miller . |
| 3,131,347 | 4/1964 | Brooks et al. . |
| 3,252,085 | 5/1966 | Whitekettle, Jr. . |
| 3,355,664 | 11/1967 | Pranke . |
| 3,370,226 | 2/1968 | Widmer . |
| 3,466,537 | 9/1969 | Eigen . |
| 3,491,290 | 1/1970 | Peschel . |
| 3,504,278 | 3/1970 | Lyons . |
| 3,564,403 | 2/1971 | Schwarz . |
| 3,628,133 | 12/1971 | Dornberger . |
| 3,694,736 | 9/1972 | Wakefield . |
| 3,789,295 | 1/1974 | Balchunas et al. . |
| 3,857,091 | 12/1974 | Kalifon . |
| 3,983,371 | 9/1976 | Siranni et al. ............... 364/507 |
| 4,052,599 | 10/1977 | Whiteley et al. ............ 364/562 |
| 4,351,030 | 9/1982 | Astfalk et al. ............... 364/507 |
| 4,416,057 | 11/1983 | Tardy . |
| 4,446,422 | 5/1984 | Koehler et al. . |
| 4,495,587 | 1/1985 | Plante et al. ................ 364/507 |
| 4,746,020 | 5/1988 | Schenk ........................ 364/507 |
| 4,951,223 | 8/1990 | Wales et al. ................. 364/507 |

FOREIGN PATENT DOCUMENTS 2090987 7/1982 United Kingdom .

Primary Examiner—Parshotam S. Lall
Assistant Examiner—Gary D. Yacura
Attorney, Agent, or Firm—Christensen, O'Connor, Johnson & Kindness

[57] ABSTRACT

An improved method and apparatus for inspecting electrical wire (10) is provided. A wire respooling machine (22) advances the electrical wire (10) from a take-off spool (12) to a take-up spool (14). An encoder (24) senses the rotation of the calibrated wheel (15) that is rotated by the electrical wire (10) and produces encoded wire length data. A splice detector (20) senses splices and insulation flaws in the wire (10) and produces a pulse for each detected splice and flaw. A controller (26) receives the encoded wire length data and detected splice and flaw pulses and produces splice and flaw location data representing the locations of the detected splices and flaws relative to the leading end of the wire (10). The controller (26) generates report data that includes said wire length data and said splice and flaw location data. A printer (28) prints the report data in a hard copy format. The controller also produces reverse splice and flaw location data representing the locations of the detected splices and flaws relative to the trailing end of the wire (10). The printer (28) prints a label containing, at least, the reverse splice and flaw location data that is suitable for affixing to the take-up spool (14).

18 Claims, 3 Drawing Sheets

METHOD AND APPARATUS FOR INSPECTING ELECTRICAL WIRE

FIELD OF THE INVENTION

This invention relates to wire inspection and, more particularly, an improved method and apparatus for inspecting electrical wire as it is unwound from a wire spool.

BACKGROUND OF THE INVENTION

Wire manufacturers produce electrical wire in long, continuous lengths. The wire is normally wound on spools for sale to wire suppliers or end users, hereinafter referred to, collectively, as customers. It is not uncommon for wire to break during the wire manufacturing process. When this occurs, the manufacturer usually splices the wire back together and the manufacturing process continues. When the breakage of an insulated electrical wire occurs, the manufacturer usually trims back the insulation on either side of the break and welds the two ends of the conductor together. Since it is not uncommon for several breaks to occur during any one production run, there may be several splices on a particular spool of wire, especially a spool containing several thousand feet of wire. An even more common cause of wire splices than breakage is manufacturing problems that occur during insulation application. Extrusion and tape wrapping are examples of manufacturing problems that occur during the application of insulation.

While splices in a spool of wire are common, they are, unfortunately, undesirable and, in some cases, unacceptable to customers because, even though splices provide electrical continuity in the wire, there is an increased likelihood of wire failure at the splices. For this reason, some customers will use only wire lengths that are free of splices. However, because splices have been difficult to identify, splices can be overlooked, and a length of wire containing a splice used in a customer's product. If such a spliced wire is later discovered, the product containing the spliced wire may have to be recalled for repair in order to prevent a later failure of the product. The aircraft industry is one industry in which spliced wires are unacceptable. Many wires used in an aircraft are bundled into wire harnesses for routing through the aircraft. If a spliced wire is inadvertently used in a wire harness, and later discovered, it must be replaced. Obviously the cost of reworking a wire harness is very costly. Perhaps even more significant is the situation where spliced wire is not discovered after it has been installed. A fault caused by a splice in the wire may cause extensive damage to surrounding wires and structures, resulting in costly repairs.

For the reasons noted above, it is of great interest to some customers, such as aircraft manufacturers, that they be able to locate every splice in a spool of wire. In some instances, manufacturers, as an aid to their customers, may attach a label to a spool indicating how many splices exist on that particular spool of wire. However, rarely, if ever, are the locations of the splices provided on the manufacturer's label. To assist a customer in locating each splice as the wire is unwound from the spool, wire manufacturers will sometimes flag splices with colored tape or some other type of marker. Unfortunately, such flagging is unreliable since manufacturers sometimes miss splices and, in any event, do not flag every splice on every spool of wire they sell. Moreover, in some instances manufacturers have used splice markers that are not readily detectable. As a result, in the past, splices have been overlooked by customers, causing great expense when a spliced wire has to be replaced or a product has to be repaired.

In addition, some customers specify an acceptable minimum distance between splices in a spool of wire. In order to provide wire that meets such specifications, a manufacturer must track the location of each splice and provide only wire that meets the customer's specs. Historically, however, customers consistently have received spools of wire with spacings between splices that do not meet their minimum distance requirements. Unfortunately, customers cannot readily verify that wire splice separation distances are within specs because, as noted above, manufactures do not normally provide splice location information.

Also of interest to customers is the ability to verify the actual length of the wire on a spool. Ideally, the actual length of wire on a spool is equal to the length of wire ordered by the customer. Practically, however, there is usually a variation between the actual length of wire on a spool and the length ordered. For customers that purchase large quantities of wire each year, these variations can translate into significant costs. For example, if every spool purchased contained slightly less than the amount ordered, the customer would end up paying for a significant amount of wire that is never actually received. Accordingly, these customers are interested in determining the actual amount of wire on each spool so that any discrepancies can be brought to the attention of the wire manufacturer or supplier.

There exist prior art machines that both measure the length of wire as it is unwound from one spool and rewound on another spool and detect splices in the wire. These machines, however, do not provide this information in a data form that can be easily retrieved by a customer. Rather, these prior art machines require that an operator read a display that gives the running total of the wire length as it advances through the machine. When a splice is detected, the advancing wire is stopped and the operator reads and records the current wire length shown on the display. One problem with these prior art machines is that they rely on an operator to read and record the information and, thus, are subject to operator error. Further, if an operator does not record the information, the information is lost, unless the wire is remeasured. Obviously, manually recording information, or remeasuring wire to obtain missed information, can be costly to a customer.

Another problem associated with these prior art machines and the manual method of recording information is that the splice locations recorded by the operator do not correlate with the order and location of the splices in the rewound wire. More specifically, the recorded locations are measured from the leading end of the wire as it comes off the first spool. Since the wire is rewound on a second spool, the trailing end of the wire becomes the leading end of the wire as the wire comes off the second spool. Accordingly, the recorded splice locations are in reverse order. In order to correct this problem, the operator must either recalculate the locations of the splices from the trailing end of the wire, or rewind the wire on the first spool. Unfortunately, both methods are undesirable. A substantial amount of operator time is required to recalculate the splice locations and the results are subject to error. Rewinding the wire onto the other spool also requires additional operator time as well as tying up the machine, which instead could be used to measure and inspect another spool of wire.

As will be readily appreciated from the foregoing discussion, there has developed a need for measuring the total length of electrical wire on a spool, as well as accurately detecting and locating each splice in the wire and generating this information in a data form that is easily stored and retrieved for later use by a customer. Further, there is a need to provide this information in a form that corresponds to the splice locations in wire rewound on another spool such that the leading and trailing ends of the wire are reversed. This invention is directed to an improved method and apparatus for inspecting electrical wire as it is unwound from a wire spool and rewound onto another wire spool, and providing wire length and splice related data in an easily retrievable form that corresponds to the leading end of the rewound spool of wire.

SUMMARY OF THE INVENTION

In accordance with the present invention, a method of inspecting electrical wire is provided. The inspection method includes the steps of: advancing electrical wire from a take-off spool to a take-up spool; measuring the length of the advancing electrical wire and producing electrical wire length data; detecting splices in the advancing electrical wire and producing a detected splice pulse for each detected splice; determining the location of each detected splice; and generating report data that includes the electrical wire length data and the splice location data. Preferably the inspection method also includes the steps of: detecting flaws in the insulation of the advancing electrical wire and producing a detected flaw pulse for each detected flaw; determining the location of the detected flaws; and including the flaw location data as part of the report data. The splice location data and the flaw location data represent the location of detected splices and detected flaws as measured from a leading end of the advancing electrical wire.

In accordance with further aspects of the present invention, the method includes the steps of printing a hard copy report that includes the report data.

In accordance with still further aspects of the present invention, the method further includes the steps of: determining the locations of the detected splices and flaws relative to a trailing end of the advancing electrical wire; producing reverse splice and flaw location data corresponding to the locations of the detected splices and flaws relative to the trailing end of the electrical wire; and printing a label that includes, at least, the reverse splice and flaw location data. Preferably, the label is suitable for affixing to the take-up spool.

In accordance with the present invention, an apparatus for carrying out the above method is also provided. The take-up spool is driven by a drive such that wire is advanced from the take-off spool onto the take-up spool. A measuring device measures the wire as it advances from the take-off spool to the take-up spool. An encoder encodes the output from the measuring device and produces encoded wire length data. A splice detector detects splices in the wire as the wire advances and produces a pulse each time a splice is detected. The splice detector also detects flaws in the insulation of the advancing electrical wire and produces a pulse each time a flaw is detected. A controller acquires and stores the encoded wire length data and the splice and flaw detection pulses. The controller produces report data that includes the length of measured wire and the location of the detected splices and flaws. A printer prints the report data. The controller also produces a drive control signal that stops the drive from driving the take-up spool after the measuring device detects the trailing end of the electrical wire.

As will be appreciated from the foregoing summary, the invention provides an improved method of measuring the length of electrical wire as the wire is unwound from one spool and rewound onto another spool, as well as determining the number and location of splices and insulation flaws in the wire and presenting this information in a data form that corresponds to the leading end of the rewound wire. The present invention also provides an apparatus for carrying out the method. Knowing the quantity and exact location of splices and insulator flaws has a number of customer advantages. Knowing this information allows a customer to readily verify compliance with purchase agreements. This information also allows a customer to program wire marking and cutting machines to anticipate the arrival of splices and insulation flaws, and ensure their removal from the production stream. Further, knowing the location of splices and insulation flaws allows a customer to program wire marking and cutting machines to maximize the yield from a spool of wire. This can be done by calculating the maximum number of wire pieces that can be obtained from each wire segment.

BRIEF DESCRIPTION OF THE DRAWINGS

The foregoing and other features and advantages of the invention will become more readily appreciated as the same becomes further understood by reference to the following detailed description when taken in conjunction with the accompanying drawings, wherein.

DETAILED DESCRIPTION OF THE PREFERRED EMBODIMENT

There has developed a need for measuring the length of wire that is wound onto a spool and determining the quantity and location of splices and insulation flaws, if any, in the wire as the wire is unwound from the spool and rewound onto another spool and presenting this information in a format consistent with the rewound wire. The present invention is an improved method and apparatus for inspecting electrical wire designed to achieve these results.

Figure 1:
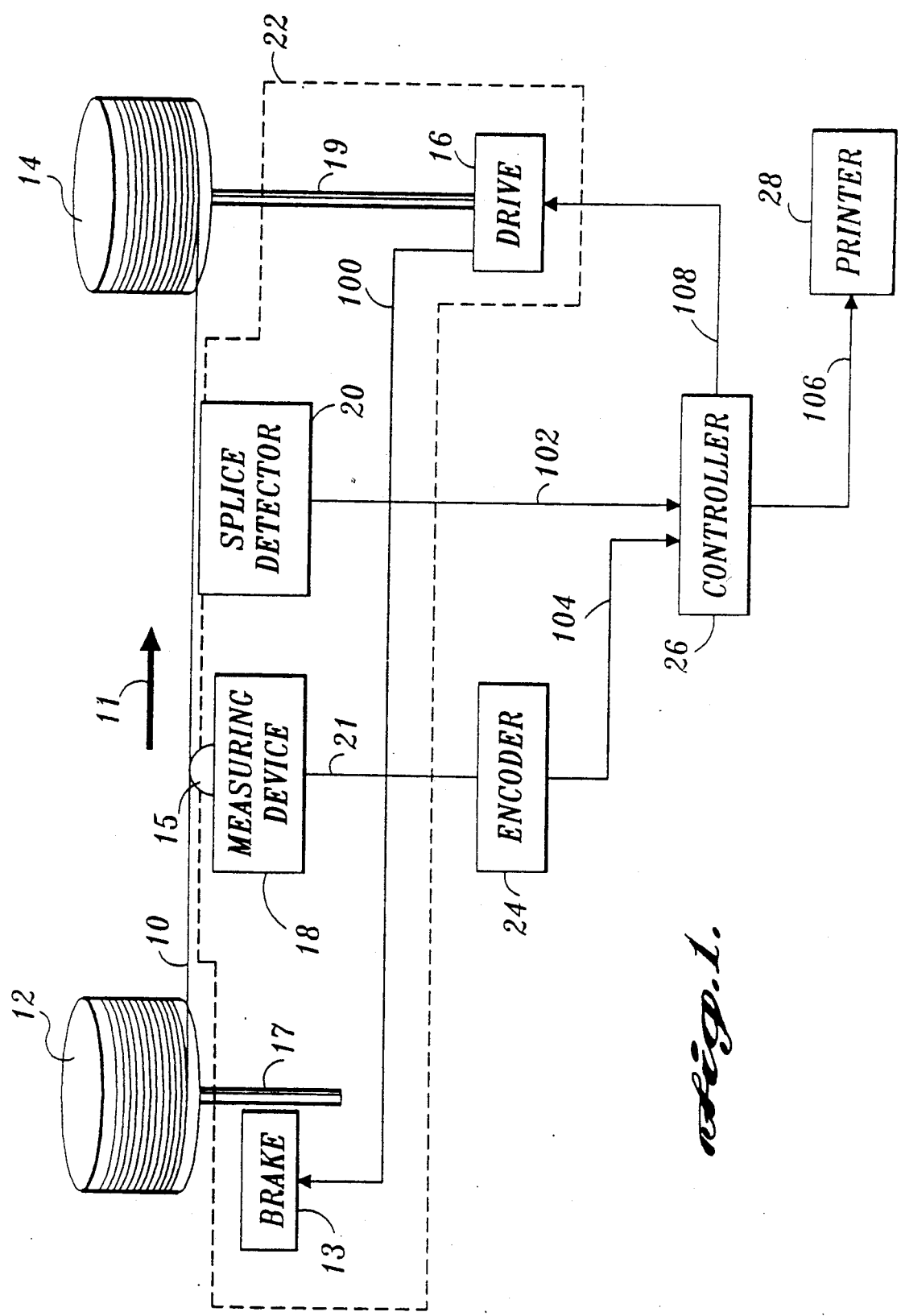
FIG. 1 is a block diagram of an apparatus formed in accordance with the present invention.

FIG. 1 is a block diagram of an inspection apparatus formed in accordance with the present invention. A customer receives electrical wire 10 from a wire manufacturer or supplier on a wire spool hereinafter referred to as a take-off spool 12. As will become better understood from the following discussion, the wire 10 is inspected by the apparatus of the present invention as the wire 10 is unwound from the take-off spool 12 and rewound onto a take-up spool 14. The wire 10 is moved from the take-off spool 12 to the take-up spool 14 by a respooler 22. The take-up spool 14 is mounted on a shaft 19, which is driven in a conventional manner by a drive 16. The take-off spool 12 is mounted on a spindle 17.

The shaft 19, drive 16 and spindle 17 form part of the respooler 22. After mounting the take-off spool 12, the respooler operator attaches the leading end of the wire 10 to the take-up spool 14 and starts the respooler 22. The drive 16 rotates the shaft 19 and the take-up spool 14. As a result, the wire 10 is moved from the take-off spool 12 to the take-up spool 14. In FIG. 1, the wire 10 is illustrated as moving from left to right, as indicated by a direction arrow 11. The take-off spool 12 and the spindle 17 are rotated by the pull of the wire 10 as the wire 10 is unwound from the take-off spool 12.

Preferably, the respooler 22 includes a brake 13 that prevents the spindle 17 and the take-off spool 12 from freewheeling and brings these elements to a controlled stop any time the drive 16 stops rotating the take-up spool 14. The brake receives a control signal from the drive 16 via line 100. The braking action applied to the take-off spool 12 prevents the wire 10 from uncoiling from the take-off spool 12 and causing slack in the wire 10 between the take-off spool 12 and the take-up spool 14. Excessive slack in the wire 10 is undesirable because the slack may cause the wire 10 to become tangled or caught in the respooler 22, resulting in possible breakage of the wire 10 when the respooler 22 is restarted.

The respooler 22 also includes a wire length measuring device 18. The measuring device 18 is positioned adjacent the wire 10 between the take-off spool 12 and the take-up spool 14. In one type of respooler, the measuring device 18 includes a calibrated wheel 15 positioned so as to contact the wire 10. The advancing wire 10 rotates the wheel 15, which causes the measuring device 18 to produce a mechanical readout, i.e., a numerical display (not shown) of the running length total of advancing wire. An encoder 24 is coupled to the measuring device 18 by line 21. The measuring device 18 and the encoder 24 may be coupled mechanically, electrically, magnetically or optically, depending on the particular devices used. In any event, line 21 is representative of a suitable coupling between the measuring device 18 and the encoder 24. In accordance with one preferred embodiment, the encoder 24 is a shaft encoder that optically senses the rotation of the wheel 15. In this embodiment, the encoder 24 produces encoded wire length data related to the length of wire 10 that advances across the wheel 15. The encoded wire length data is produced on line 104. Alternatively, the encoder may produce a pulse for each predetermined length of wire 10 advancing across the wheel 15. The pulses could then be applied to the controller 26, which would accumulate the pulses and produce encoded wire length data.

The respooler 22 also includes a splice detector 20. The splice detector 20 is positioned adjacent the advancing wire 10, between the take-off spool 12 and the take-up spool 14. In one type of respooler, the splice detector 20 is located between the measuring device 18 and the take-up spool 14. The splice detector 20 detects splices in the advancing wire 10 and produces a pulse on line 102 each time a splice is detected. In accordance with one preferred embodiment, the splice detector 20 is a dielectric tester that detects a splice by sensing the absence of insulation on the advancing wire 10. This type of splice detector is suitable for use in situations where wire manufacturers remove, or strip back, the insulation on either side of a splice.

Dielectric splice detectors 20 of the type described above are well known in the wire testing art. In one form, a dielectric splice detector charges up a plate or other conductive surface that is in close proximity to the advancing wire 10, which is grounded. The value of the voltage at the charged plate is such that the insulation on the wire is sufficient to prevent conduction between the plate and the wire conductor. When an uninsulated section of the wire 10 advances past the dielectric tester, conduction, usually in the form of a spark, occurs between the plate and the wire conductor. Conduction between the plate and the wire conductor causes the splice detector to produce a pulse on line 102. A dielectric splice detector of the type described above will also detect a flaw, such as a pin hole, in the insulation of the wire 10 in substantially the same manner that a splice is detected. That is, a flaw in the insulation of the wire 10 will cause conduction between the plate and the wire conductor and, thus, the dielectric splice detector will produce a pulse on line 102.

As will be appreciated by persons skilled in the wire inspection art, other types of detectors may also be used to detect splices. For example, the splice detector 20 may take the form of a sensor that senses the outer diameter of a wire 10. Such devices detect the absence of insulation in the area of a splice by sensing a smaller than normal outer wire diameter. Similarly, such devices also detect a splice that has been taped, because the tape creates a larger outer wire diameter. However, such devices will not detect a flaw, such as a pin hole, in wire insulation.

Respoolers 22, of the type illustrated in FIG. 1, that include a measuring device 18, splice detector 20, drive 16, spindle 17, and shaft 19, are well known in the prior art. An example of such a prior art respooler is the Model 656 machine built by the Kenrake Company, Inc., Tulsa, Okla. While the preferred embodiment of the invention is being described in terms of a respooling machine of the type manufactured by the Kenrake Co., it is to be understood that the other machines that advance the wire from a take-off spool to a take-up spool may be used in an actual embodiment of the invention. It is also to be understood that the wire length measuring device 18 and the splice detector 20 may be separate devices rather than part of a respooling machine.

A controller 26 receives and stores the encoded wire length data applied to line 104 by the encoder 24 and the splice and flaw location pulses applied to line 102 by the splice detector 20. As will become better understood from the following discussion, the controller 26 analyzes the wire length data and splice and flaw location pulses and outputs consolidated data on line 106. The consolidated data is applied to a printer 28 that produces a conventional hard copy print-out. In one actual embodiment of the present invention, the consolidated data on line 106 includes such information as: total wire length; the quantity and location of splices and flaws in the insulation; and the lengths of the wire between the splices and flaws, hereinafter referred to as wire segments. Other information also may be printed, such as: the average length of a wire segment, the minimum and maximum wire segment lengths, and the standard deviation of the wire segment lengths from the average wire segment lengths. Additional information, which may be supplied by the user via keyboard or other conventional data entry means may also be printed. This additional information might include, for example: wire type, manufacturer's name, code numbers, etc. Obviously, the above information is merely illustrative of information that may be generated by the controller 26 and printed by the printer 28, and is not intended to be an exclusive list.

Preferably, the controller 26 "reverses" the splice and flaw location data so that it agrees with the order and location of splices and flaws in the wire 10 on the take-up spool 14. More specifically, as will become better understood from the following discussion, preferably, the controller 26 reverses the splice and flaw location data in terms of the trailing end of the wire 10 (as opposed to the leading end) since the trailing end of the wire becomes the leading end when the wire 10 leaves the take-off spool 12. The controller 26 then instructs the printer 28 to print the reverse splice and flaw location data on a label that can be attached to the take-up spool 14. In the past, if such reverse splice and flaw location information was desired, it had to be calculated by the operator. As an alternative, the wire 10 could be rewound back onto the take-off spool 12, so that the order and location of the splices and flaws agreed with the computed splice information. Either way, because correlating the actual splice and flaw location and order with the computed splice location data in terms of the leading end of the wire is costly and time consuming, it is undesirable. The use of the controller 26 in the present invention to "reverse" this data eliminates the cost and time associated with this process.

The information located on the label may be used by other pieces of equipment that work with the wire 10. For example, wire coding machines may be used to unwind the wire 10 from the take-up spool 14, apply coded markings to the wire 10, and cut the wire 10 to desired lengths for making up wire harnesses. An operator can input the splice and flaw locations (from the label) into the coding machine so that the coding machine will automatically cut the splices and flaws out of the wire 10. In this regard, it is to be understood that the label information may be provided in a machine readable form, such as bar code, for example, which can be automatically read by a wire coding (or other) machine. By providing this information on a label attached to the take-up spool 14, the chances of a length of wire containing a splice or an insulation flaw finding its way into a wiring harness or other customer product are greatly reduced.

Preferably, the controller 26 also provides an output on line 108 that controls the drive 16. More specifically, in a manner to be discussed more fully below, if the controller senses that the wire 10 is not advancing from the take-off spool 12 to the take-up spool 14, a control signal is produced on line 108 that causes the drive to stop rotating the shaft 19. Such a situation will arise if the advancing wire 10 breaks or when the trailing end of the wire 10 passes the measuring device 18.

Figure 2:
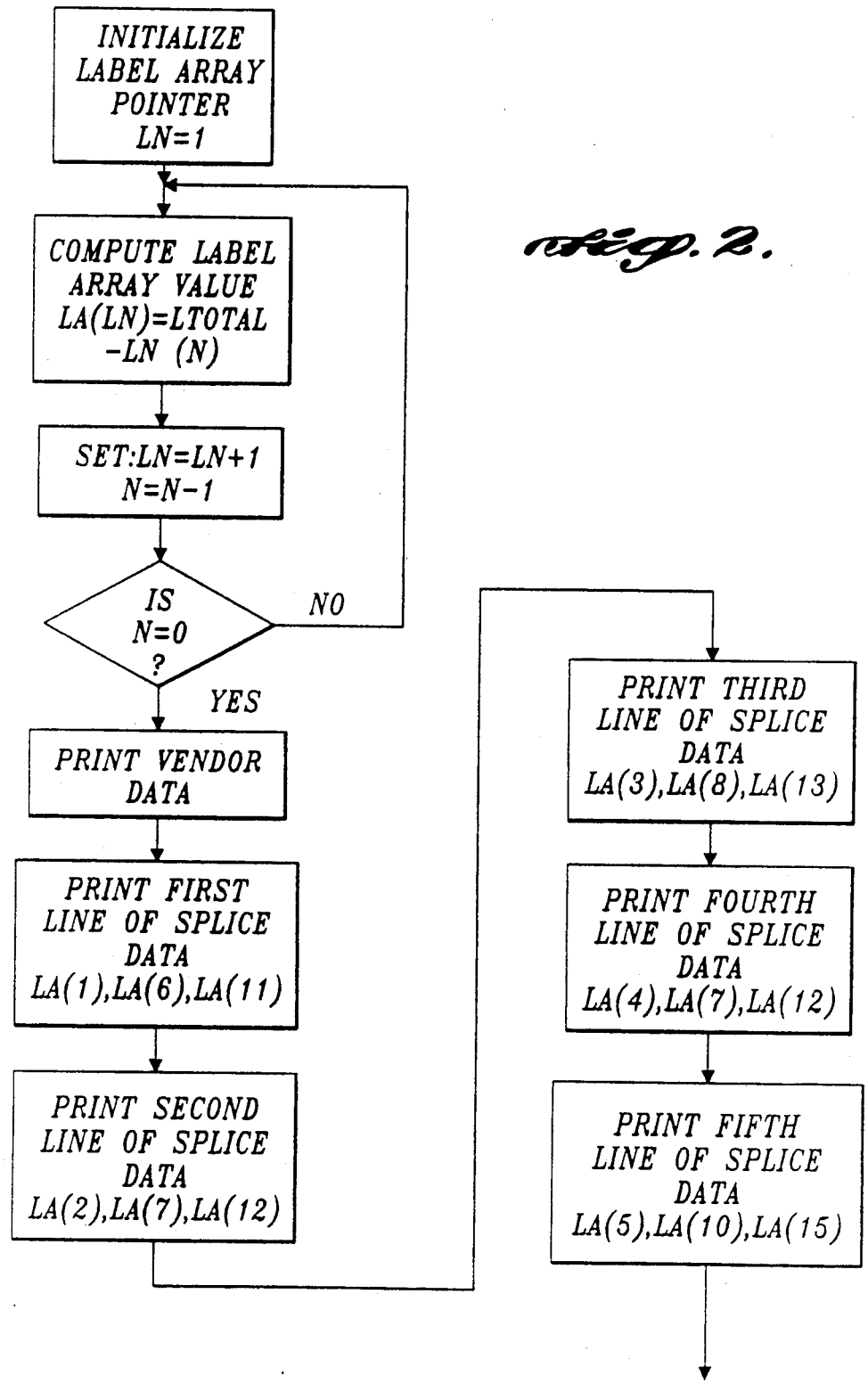
FIG. 2 is a flow chart depicting the functional steps of a program used to control the controller of the apparatus depicted in FIG. 1.

FIG. 2 is a flow chart depicting in functional form the steps of a program used to control the controller 26 depicted in FIG. 1 and discussed above. The user (i.e., the customer) initially inputs any desired vendor and user data to the controller 26 via a keyboard, bar code reader, or other suitable means (not shown in FIG. 2). The vendor and user data that is inputted may be whatever the user desires, but will most likely include such information as: wire manufacturer and/or supplier name; wire type; and nominal wire length and nominal number of splices (if provided by the manufacturer or supplier).

Next, variables representing a running total of the measured wire length, denoted L, and the quantity of detected splices and flaws, denoted N, are initialized. As depicted in FIG. 2, both L and N are initially set equal to zero. As will be discussed more fully below, L is updated each time the controller 26 reads the encoded length data produced by the encoder 24 and N is updated each time a splice or flaw in the insulation is detected by the splice detector 20 (FIG. 1). For ease of understanding the present invention, splices and flaws are discussed collectively. It is to be understood, however, that splices and insulation flaws may be treated separately. In such a situation, another variable, which could be denoted M, may be used to track the quantity of detected insulation flaws, whereas N would only represent the quantity of detected splices.

After the respooler 22 has been started, which in accordance with the presently preferred embodiment is done manually by the operator, the program determines whether the wire 10 is advancing. One way to determine whether the wire 10 is advancing is to sense an increase in the values of the encoded length data. This is accomplished by reading the encoded length data and then comparing the read value with the previous value. An increase in value indicates movement of the wire. If the change in data values indicates the wire is advancing (i.e., moving from the take-off spool 12 to the take-up spool 14), the program proceeds to the next step, which is discussed below. If, however, no change in data values has occurred, the encoded data value is reread and the new value is compared with the prior value. This loop is repeated until the operator starts the respooler. When advancement of the wire 10 is detected, the program proceeds to the next step.

Once advancement of the wire 10 has been detected, the program instructs the controller 26 to store the encoded wire length data as an updated wire length value, L. More specifically, the program instructs the controller 26 to update the previous encoded wire length data value (initially 0) with the current encoded wire length data value. Accordingly, the value of L is the running total of the measured length of the advancing wire 10 with respect to a leading end of the wire 10 transferred from the take-off spool 12 (FIG. 1) to the take-up spool 14.

Next, the program performs a test to determine if a splice or insulation flaw in the wire 10 has been detected, i.e., if a pulse on line 102 indicative of the detection of a splice or flaw has been received by the controller 26. When such a pulse is received, the program updates a number (N) that denotes the quantity of detected splices and flaws (i.e., $N = N + 1$). Next, the program determines the location of the detected splice or flaw, denoted $L_N$, by setting $L_N$ equal to the present value of the running total of the wire length (i.e., $L_N = L$). Thus, the detected splice location is determined relative to the leading end of the wire 10. The program then instructs the controller 26 to store this value of $L_N$.

Once the location of the splice or flaw has been determined, or if a splice or flaw has not been detected, the program determines whether the trailing end of the wire 10 has been detected. The trailing end of the wire 10 is detected when a lack of motion of the previously advancing wire 10 is sensed. Preferably, the controller 26 receives end-of-wire data from a separate sensor (not shown in FIG. 1) that senses the end of the wire 10 as it passes by the sensor. If the controller 26 does not receive end-of-wire data from a separate sensor indicative of the passing of the trailing end of the wire 10, the program returns to the point where the next encoded length data is read, as illustrated in FIG. 2. If, however, the trailing end of the wire 10 is detected, the program instructs the controller 26 to stop the respooler 22. Preferably, a known delay between detection of the trailing end of the wire 10 and the instruction to stop the respooler 22 is introduced to permit the trailing end to reach the take-up spool 14.

Next, the program instructs the controller 26 to compile (i.e., compute) report data and to produce a report. Once the values for the wire length and quantity and location of the splices have been determined, they are used to prepare user-defined reports. For example, the values stored in the controller 26 can be used to compute such report data as: the actual measured length of the wire 10; the difference, if any, between the actual measured length and the nominal length (which, as noted above, is provided by the wire supplier); the quantity and location of the detected splices and insulation flaws measured from the leading end of the wire 10 (as the wire 10 is taken off the take-up spool); and the length of the wire between splices and flaws (i.e., the wire segments). As noted above, wire manufacturer information or other user-defined information may also be included in the report. For example, the program may instruct the controller 26 to perform a statistical analysis of the wire length and splice and flaw data and produce such information as: average, minimum, and maximum wire segment lengths, and the standard deviation from the average wire segment lengths. It is to be understood that the report is user defined and that the above information is merely illustrative of the report data that may be compiled. Once the report data has been compiled, a report is produced. The report may be printed in hard copy and/or stored as report data on disk for later retrieval.

Next, the program instructs the controller 26 to determine the splice and flaw locations from the trailing end of the wire 10. The importance of this data "reversal" becomes evident when the final arrangement of the wire 10 on the take-up spool 14 is considered. The wire 10 is reversed when it is unwound from the take-off spool 12 and rewound upon the take-up spool 14. That is, the trailing end of the wire 10 on the take-off spool 12 now becomes the leading end of the wire 10 on the take-up spool 14. Accordingly, in order to provide meaningful information to the user, who dispenses the wire 10 from the take-up spool 14, the splice and flaw locations are recomputed in terms of their distance from the trailing end of the wire 10. Thereafter a label is printed.

Figure 3:
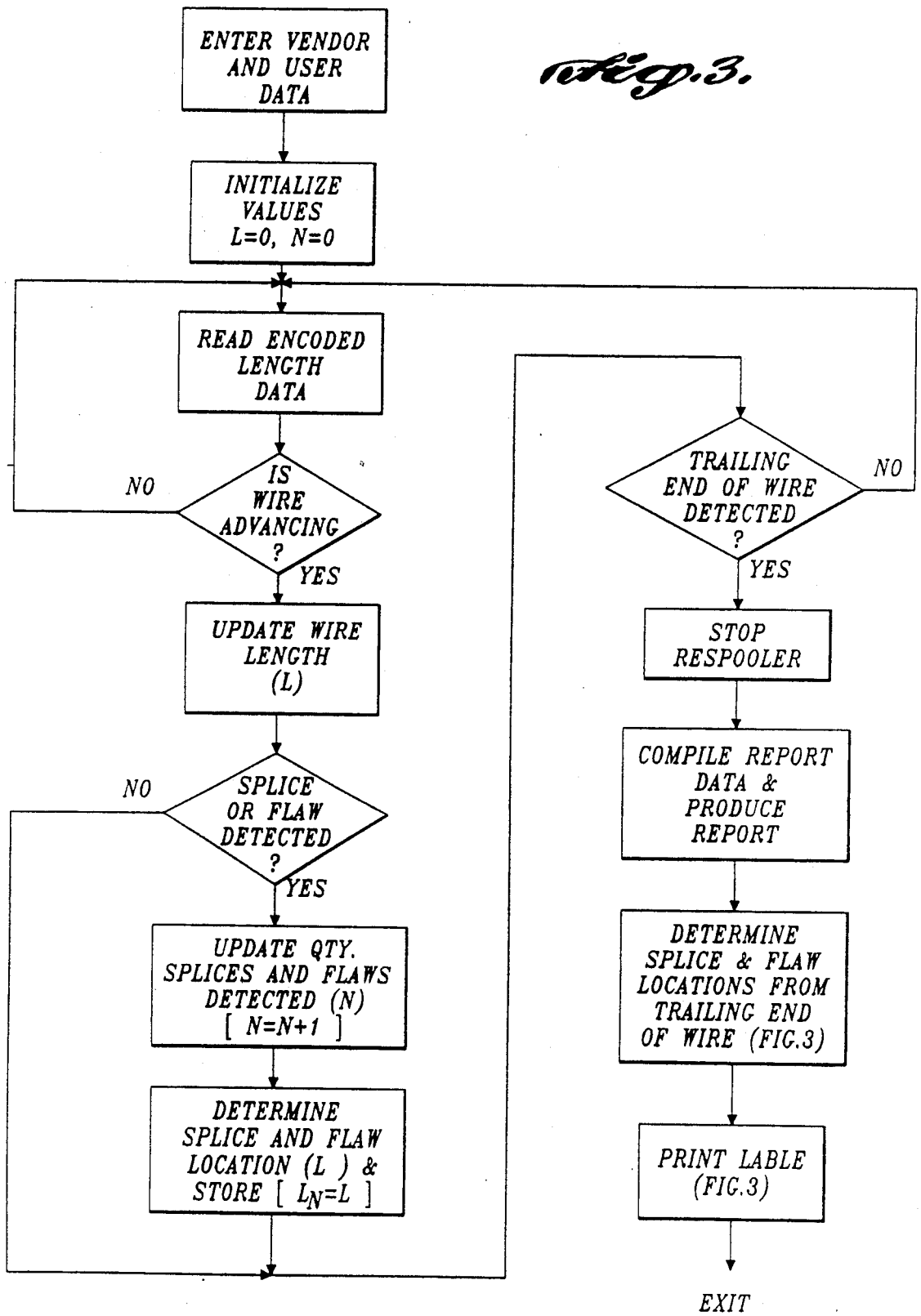
FIG. 3 is a flow chart depicting in more detail the data reversal and label printing steps illustrated in FIG. 2.

The data reversal and label printing steps are depicted in detail in FIG. 3. The data reversal step comprises computing a label array that contains the location of splices (and flaws). The array elements are identified by the term LA(LN), where LN is a label array pointer. The label array element values are based on the splice (and flaw) location array values, $L_N(N)$, determined previously (FIG. 2).

As shown in FIG. 3, the label array pointer is first initialized by setting LN=1. Next, the program instructs the controller to determine a label array value for this pointer position. The label array value, LA(1), is determined by subtracting the last splice (or flaw) location value, $L_N(N)$, from the total length of the wire ($L_{TOTAL}$) determined when the wire was moved from the take-off spool to the take-up spool. The thusly determined value for LA(1) is stored.

Next, the label array pointer is incremented and the current value of detected splices is decremented, i.e., LN=LN+1 and N=N-1. If N does not equal zero, which would indicate that all detected splice and flaw locations have been reversed, the program computes the next label array value, i.e., computes a value for LA(2). This is accomplished by subtracting the second to the last splice or flaw location value, i.e., LN(N-1), from $L_{TOTAL}$. This loop is repeated until all LA values have been calculated. When all of the LA, i.e., reversed splice and flaw location values have been determined (i.e., when N=0), the program instructs the printer 28 (FIG. 1) to print a label. Preferably, the printed label includes vendor data, discussed above, as well as the reversed splice and flaw location data, produced in a row/column array as shown in FIG. 3. Preferably, the label has an adhesive backing so that it can then be attached to the corresponding take-up spool 14.

As can be readily appreciated from the foregoing description, the invention provides an improved method and apparatus for inspecting electrical wire as the wire is unwound from a take-off spool and rewound onto a take-up spool and reversing wire related data to agree with the arrangement of the wire on the take-up spool. While a preferred embodiment of the invention has been illustrated and described herein, it is to be understood that within the scope of the appended claims, various changes can be made. For example, the method and apparatus of the present invention can be practiced with a wire respooling machine different from the respooler discussed above and illustrated in FIG. 1. A wire diameter sensing device, such as a laser micrometer, could be used to detect a splice instead of a dielectric tester and an electronic measuring device could be used that would eliminate the need for a separate wire measuring device and encoder. Also, other report formats could easily be prepared. Finally, the steps of the program used to control the controller are merely illustrative. Hence, within the scope of the appended claims, it is to be understood that the invention can be practiced otherwise than as specifically described herein.

The embodiments of the invention in which an exclusive property or privilege is claimed are defined as follows:

1. A method of inspecting an insulated electrical wire comprising the steps of:
   (a) advancing the electrical wire from a first position to a second position;
   (b) measuring the length of the electrical wire as it is advanced and producing electrical wire length data representative of the running total length of the electrical wire;
   (c) detecting splices in the electrical wire and producing a splice pulse for each detected splice;
   (d) using the splice pulses and the electrical wire length data to determine the location of the detected splices along the length of the electrical wire and producing splice location data that are representative of the locations of the splices as measured from a first reference point proximate to a leading end of the electrical wire as the electrical wire is advanced from the first position to the second position;
   (e) producing reversed splice location data that are representative of the locations of the splices as measured from a second reference point proximate to a trailing end of the electrical wire; and (f) generating a report that includes the electrical wire length data, the splice location data, and the reversed splice location data.

2. The insulated electrical wire inspection method as in claim 1, wherein the measuring step further comprises the steps of:
(a) producing encoded wire length data as the electrical wire is advanced from the first position to the second position; and
(b) storing the encoded wire length data as the running total length of the electrical wire.

3. The insulated electrical wire inspection method as in claim 2, wherein the storing step further comprises the step of updating a first value of the stored encoded wire length data with a second value of the encoded wire length data, the second value being produced subsequent in time to the first value such that the second value represents a current value of the running total length of the electrical wire.

4. The insulated electrical wire inspection method as in claim 3, further comprising the step of determining when the trailing end of the electrical wire advancing from the first position to the second position is reached, the determining step comprising the substeps of:
(a) comparing the first value of the encoded wire length data with the second value of the encoded wire length data; and
(b) producing end-of-wire data when the first value and the second value are substantially the same, the end-of-wire data being representative of the trailing end of the electrical wire.

5. The insulated electrical wire inspection method as in claim 4, further comprising the step of stopping the electrical wire from advancing from the first position to the second position when the end-of-wire data are produced.

6. The insulated electrical wire inspection method as in claim 5, wherein the splice detecting step further comprises the step of detecting an uninsulated portion of the electrical wire.

7. The insulated electrical wire inspection method as in claim 6, wherein the report is printed.

8. Apparatus for inspecting an insulated electrical wire comprising:
(a) advancing means for advancing the electrical wire from a first position to a second position;
(b) measuring means for measuring the length of the electrical wire and for producing electrical wire length data;
(c) splice detecting means for detecting splices in the electrical wire and for producing a splice pulse for each detected splice; and
(d) a controller for controlling the advancing means and for receiving the electrical wire length data from the measuring means and the splice pulse from the splice detecting means, said controller using the detected splice pulses and the electrical wire length data to determine the location of the detected splices and to produce splice location data representative of the location of the detected splices as measured from a leading end of the electrical wire as it advances, and to produce reverse splice location data representative of the location of the detected splices as measured from a trailing end of said electrical wire as it advances, the controller producing a report that includes the electrical wire length data, the splice location data, and the reverse splice location data.

9. The apparatus as in claim 8, wherein the advancing means comprises a wire respooling machine containing a take-off spool located at the first position and a take-up spool located at the second position, the respooling machine causing the electrical wire to advance by unwinding the electrical wire from the take-off spool and rewinding the electrical wire onto the take-up spool.

10. The apparatus as in claim 9, wherein the wire respooling machine includes a drive for rotating the take-up spool, the controller controlling the drive such that the electrical wire causes the take-off spool to rotate as the electrical wire is advanced.

11. The apparatus as in claim 10, wherein the wire respooling machine further comprises a brake for stopping the rotation of the take-off spool when the drive stops the rotation of the take-up spool.

12. The apparatus as in claim 8, wherein said measuring means includes:
(a) a measuring device having a calibrated wheel that is rotated by the electrical wire as it is advanced; and
(b) an encoder coupled to the measuring device for sensing the rotation of the calibrated wheel and producing the electrical wire length data.

13. The apparatus as in claim 12, wherein the apparatus includes printing means for printing a hard copy of the report.

14. The apparatus as in claim 13, wherein the printing means also prints a label suitable for affixing to the take-up spool, wherein the label contains the reverse splice location data.

15. The apparatus as in claim 14, wherein the reverse splice location data is printed on said label in a human readable form.

16. The apparatus as in claim 8, including printing means for printing a label suitable for affixing to the take-up spool, the label containing the reverse splice location data.

17. The apparatus as in claim 16, wherein the reverse splice location data is printed on the label in a human readable form.

18. In an apparatus for inspecting an insulated electrical wire, including a wire respooling machine for advancing the electrical wire from a take-off spool to a take-up spool, a measuring device having a calibrated wheel that is rotated by the advancing electrical wire and a splice detector for detecting splices in the advancing electrical wire and producing a splice pulse for each detected splice, the improvement comprising: an encoder coupled to said measuring device for sensing the rotation of said calibrated wheel and producing encoded wire length data; and a controller for controlling the wire respooling machine, said controller receiving said detected splice pulses and said encoded wire length data to determine the location of the splices and to produce splice location data representative of the location of said splices as measured from a leading end of the electrical wire, wherein the controller also operates to reverse said splice location data to produce reverse splice location data representative of said location of the splices as measured from a trailing end of said electrical wire.

* * * * *